United States Patent [19]
Lao et al.

[11] Patent Number: 5,304,836
[45] Date of Patent: Apr. 19, 1994

[54] HIGH VOLTAGE FIELD EFFECT TRANSISTOR HAVING A SMALL RATIO OF CHANNEL WIDTH TO CHANNEL LENGTH AND METHOD OF MANUFACTURE

[75] Inventors: Guillermo Lao, Hawthorne; Dale Sumida, Los Angeles; Anh K. Hoang-Le, Danville, both of Calif.

[73] Assignee: Xerox Corporation, Stamford, Conn.

[21] Appl. No.: 878,081

[22] Filed: May 4, 1992

[51] Int. Cl.$^5$ .............................................. H01L 29/06
[52] U.S. Cl. ..................................... 257/399; 257/400; 257/401; 257/403; 257/409
[58] Field of Search ................ 257/398, 401, 395, 399, 257/403, 402, 409, 394, 288

[56] References Cited

U.S. PATENT DOCUMENTS

| | | | |
|---|---|---|---|
| 4,288,806 | 9/1981 | Ronen | 257/401 |
| 4,680,605 | 7/1987 | Martin et al. | 257/398 |
| 4,811,075 | 3/1989 | Eklund | 257/409 |
| 5,164,806 | 11/1992 | Nagatomo et al. | 257/395 |
| 5,182,622 | 1/1993 | Iizuka et al. | 257/249 |

Primary Examiner—Andrew J. James
Assistant Examiner—Courtney A. Bowers
Attorney, Agent, or Firm—Nola M. McBain

[57] ABSTRACT

The present invention is directed to a high voltage field effect transistor (FET) constructed on the major surface of a substrate of a first conductivity type. The FET includes a drain region of a second conductivity type located in the major surface and a generally annular drift region of the second conductivity type, located in the major surface and outside of the drain region. A generally annular gate is located on the major surface and outside of the drift region, and a generally annular source region is located in the major surface and outside of the gate. A first channel stop is located in the major surface and outboard of the source region, and a second channel stop located in the major surface and beneath the gate, having at least two portions in close proximity to each other. A channel region is located in the major surface and between the two second channel stop portions. The second channel stop blocks communication between the source region and the drift region except through the channel region.

10 Claims, 4 Drawing Sheets

HIGH VOLTAGE FIELD EFFECT TRANSISTOR HAVING A SMALL RATIO OF CHANNEL WIDTH TO CHANNEL LENGTH AND METHOD OF MANUFACTURE

BACKGROUND

This invention relates to high voltage field effect transistors (FETs), and more particularly to a method of forming a high voltage FET having a relatively small ratio of channel width to channel length (W/L), and to an FET made using this method.

High voltage FETs are used in a wide variety of applications, most of which require the FET to handle relatively large currents. The ability to handle relatively large currents is a function of the ratio of the channel width to the channel length (W/L) of the FET, with high current handling ability indicated by a large W/L. All high voltage FETs, whether designed to handle large currents or not, share design features necessitated by high voltages. A typical design for a high voltage FET places an annular source in the major surface of a semiconductor substrate. Outside of the source is a channel stop that isolates the FET from other devices on the substrate. Inboard and in contact with the source is a gate. Inboard of the gate is a drift region with an overlying region of field oxide. Inboard of the drift region and the drift field oxide is a circular drain region, the center of the FET. The annular and circular shapes of the elements of the FET act to diffuse field lines. The FET can be either depletion mode or enhancement mode, depending on whether the channel is doped with the same impurity type as the source, drain and drift region (i.e., depletion mode), or whether the channel is of opposite type (i.e., enhancement mode).

A typical high voltage FET designed to handle large current will have an annular gate. Beneath the gate is a channel, which is separated from the gate by a gate insulator. The channel is the portion of the substrate controlled by the gate, and hence is annular like the gate above. The annular shape of the channel gives the device a relatively large W/L, since the length is the radial thickness of the gate, and the width is approximately the circumference of the gate. To make the annular channel, the annular gate is used to mask the implanting of impurities to form source and drain regions. In this manner, the source region, channel region and drain region are self-aligned.

The present designs of high voltage FETs have generally proven adequate, as have the methods of making them. However, the designs and methods are optimized for FETs that handle relatively large current.

SUMMARY OF THE INVENTION

The present invention is directed to a high voltage field effect transistor (FET) constructed on the major surface of a substrate of a first conductivity type. The FET includes a drain region of a second conductivity type located in the major surface and a generally annular drift region of the second conductivity type, located in the major surface and outside of the drain region. A generally annular gate is located on the major surface and outside of the drift region, and a generally annular source region is located in the major surface and outside of the gate. A first channel stop is located in the major surface and outside of the source region, and a second channel stop located in the major surface and beneath the gate, having at least two portions in close proximity to each other. A channel region is located in the major surface and between the two second channel stop portions. The second channel stop blocks communication between the source region and the drift region except through the channel region.

According to another aspect of the invention, the channel region is of the second conductivity type.

According to another aspect of the invention, the first channel stop includes a first field implant region of first conductivity type located in the major surface and a first field oxide region positioned in the major surface above the first field implant region. Moreover, the second channel stop can include a second field implant region, and the second channel stop can include a second field oxide region positioned above the second field implant region.

According to another aspect of the invention, a high voltage FET is provided having an inverted source and drain construction. In particular, the FET is constructed on the major surface of a substrate of a first conductivity type. The FET includes a source region of a second conductivity type located in the major surface, a generally annular gate located on the major surface and outside of the source region, a generally annular first drift region of the second conductivity type, located in the major surface and outboard of the source region, a generally annular drain region located in the major surface and outside of the first drift region, and a generally annular second drift region of the second conductivity type, located in the major surface and outside of the gate. A first channel stop is located in the major surface and outside of the drain region, and a second channel stop is located in the major surface and beneath the gate, having at least two portions in close proximity to each other. A channel region is located in the major surface and between the two second channel stop portions, the second channel stop blocking communication between the source region and the first drift region except through the channel region.

According to another aspect of the invention, a method is provided for fabricating a high voltage FET. The method includes the steps of providing a semiconductor substrate of a first conductivity type, then forming in the same step a first field implant region of the first conductivity type, and a second field implant region of the first conductivity type having a generally annular shape, a first end and a second end, with the first end and second end closely spaced to define a channel region therebetween. Next, a generally annular gate region is formed above the channel region and above the generally annular region of the first conductivity type. Finally, source and drain regions of second conductivity type are formed.

Other aspects of the invention will become apparent from the following description with reference to the drawings, wherein:

DETAILED DESCRIPTION OF THE PREFERRED EMBODIMENTS

Figure 1:
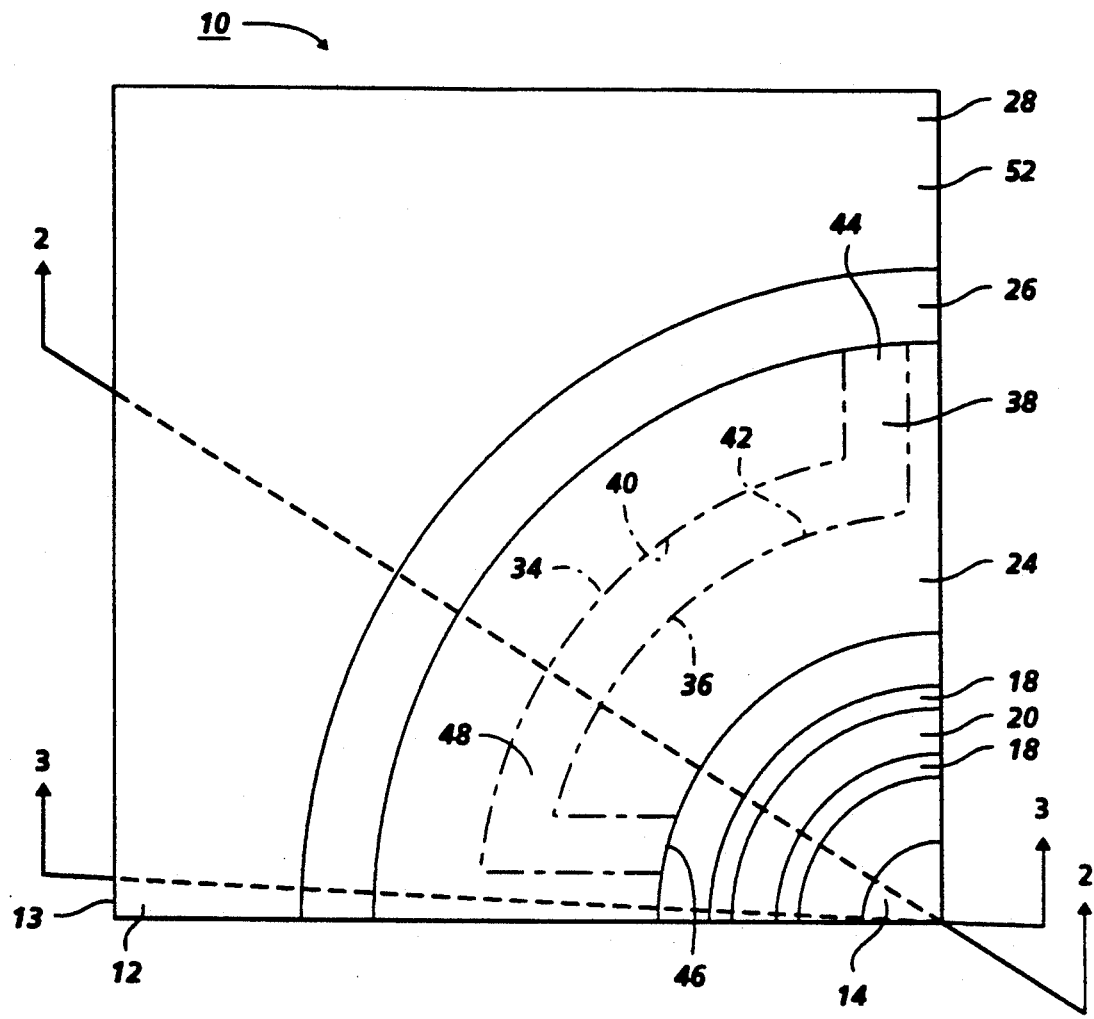
FIG. 1 is a partial plan view of a high voltage field effect transistor (FET) made according to the method of the present invention and embodying the present invention.
Figure 2:
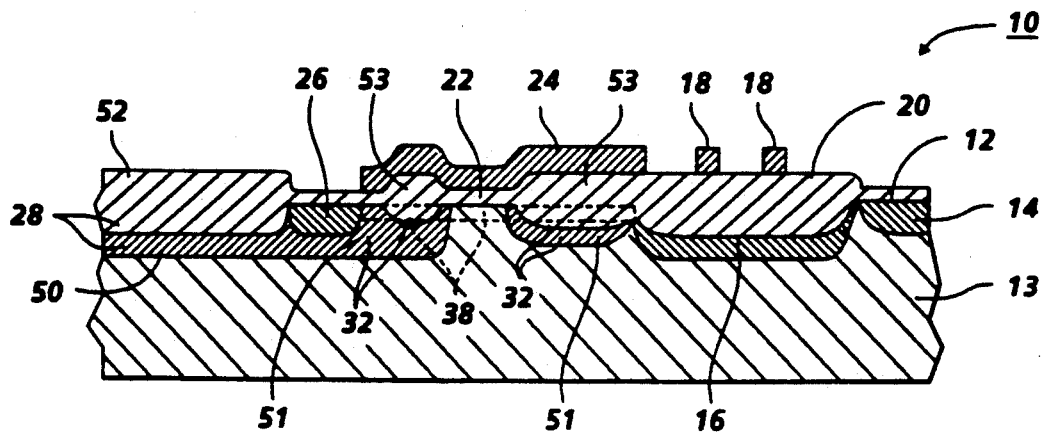
FIG. 2 is a cross-sectional view of the FET of FIG. 1 taken in the direction of the arrows.
Figure 3:
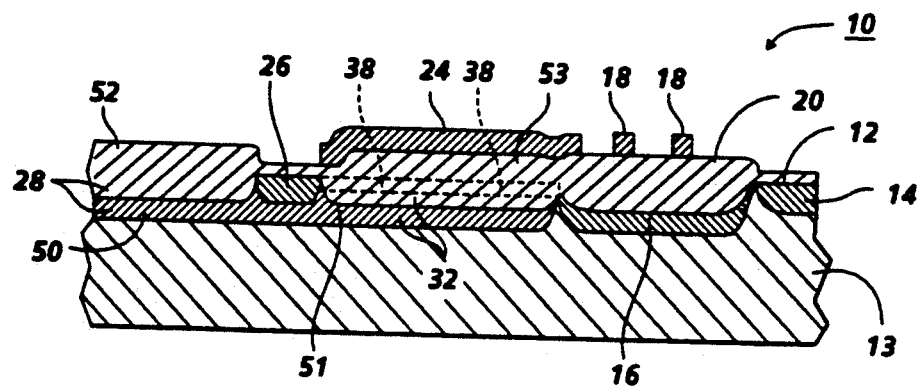
FIG. 3 is a cross-sectional view of the FET of FIG. 1 taken in the direction of the arrows.

Referring now to FIGS. 1, 2 and 3, there is shown a high voltage depletion mode n-channel metal oxide semiconductor (NMOS) field effect transistor (FET) 10 embodying the present invention. FET 10 is constructed on a major surface 12 of a substrate 13, which is doped p+. Substrate 13 is doped with boron in a peak concentration of about $8 \times 10^{13}$ atoms per cubic centimeter. Like conventional FETs, FET 10 includes generally circular drain region 14, doped n+. Preferably drain region 14 is doped with phosphorus in a peak concentration of about $10^{19}$ to $10^{20}$ atoms per cubic centimeter. Drain region 14 has a diameter of about 50 micrometers. Outside of drain region 14 is drift region 16 that contacts and surrounds drain region 14. Drift region 16 is generally annular, and doped n−. Preferably drift region 16 has a radial thickness of about 330 micrometers, and is doped with phosphorus in a peak concentration of about $10^{16}$ atoms per cubic centimeter.

FET 10 includes field plate 18 to spread field lines in the underlying drift region 16. Field plate 18 is generally annular in shape, is positioned above drift region 16, and is separated from drift region 16 by generally annular field oxide region 20. Preferably field plate 18 consists of two or more concentric, conductive rings, connected by a high resistance polysilicon connector (not shown) that acts as a voltage divider. Alternatively, field plate 18 consists of a conductive spiral.

Outside of drift region 16 is gate oxide region 22. Preferably gate oxide region 22 consists of a 1000 angstroms thick layer of thermally grown silicon dioxide having a radial thickness of about 14 micrometers. Overlying gate oxide region 22 is gate 24. Gate 24 also overlies a part of field oxide region 20 adjacent gate oxide region 22. Outside of gate 24 is generally annular source region 26, which is doped n+. Preferably source region 26 has a radial thickness of about 15 micrometers, and is doped with phosphorus in a peak concentration of about $10^{19}$ to $10^{20}$ atoms per cubic centimeter. Outside of source region 26 is a channel stop portion 28. Channel stop portion 28 serves to isolate FET 10 from other devices (not shown) on major surface 12.

In accordance with the present invention, FET 10 includes a channel stop portion 32 that is positioned underneath gate 24 between and in contact with source region 26 and drift region 16. Channel stop portion 32 includes first end 34 and second end 36 that are positioned in close proximity to each other. Ends 34 and 36 define between themselves channel region 38. Channel region 38 includes ends 44 and 46 that contact source region 26 and drift region 16, respectively. Channel region 38 also includes sides 40 and 42 that contact channel stop ends 34 and 36, respectively. Although gate 24 overlies both channel stop portion 32 and channel region 38, communication between source region 26 and drift region 16 (and then drain region 14) is only possible through channel region 38, since channel stop portion 32 blocks or stops other communication between source region 26 and drift region 16.

The circular shape of drain region 14 and the annular shape of drift region 16, gate 24 and source 26 act to minimize the concentration of field lines, as is well know to one skilled in the art. In FIGS. 1, 2 and 3, the radial dimensions of gate 24 and gate oxide 22 are exaggerated with respect to the radial dimensions of source and drain regions 26 and 14, and drift region 16, to better illustrate the structure of gate 24 and channel region 38.

In a conventional high voltage FET (not shown), the channel region is the entire portion of the major surface underlying the gate and gate oxide. Thus an annular gate would produce an annular channel having the device characteristic of a large W/L. Since FET 10 has channel stop portion 32 to tailor the shape of channel region 38, FET 10 can be designed to have a small W/L and a long channel length.

Preferably, channel stop region ends 34 and 36 are shaped and positioned such that channel region 38 includes a main portion 48 having a uniform width and shaped in an arc that is generally axially aligned with the overlying annular gate 24. The length of main portion 48 can vary from a fraction of the circumference of overlying gate 24, to greater than gate 24 circumference by the simple expedience of using a spiral shape for main channel region portion 48. Of course, with this topology for channel region 38, the maximum width of channel region 38 must be less than the radial separation of source region 26 from drift region 16.

Preferably channel stop portions 28 and 32 consist of respective underlying field implant portions 50 and 51, doped p+ with boron in a peak concentration of about $10^{17}$ atoms per cubic centimeter, and overlying field implant portions 50 and 51 consist of respective field oxide portions 52 and 53. Alternatively, channel stop portion 32 can be constructed of either field implant portion 51 or field oxide portion 53, but not both. However, constructing channel stop portions 32 with only one of either field implant portion 51 or field oxide portion 53 provides less isolation than that provided by the combination of field implant portion 51 and field oxide portion 53.

Figure 4:
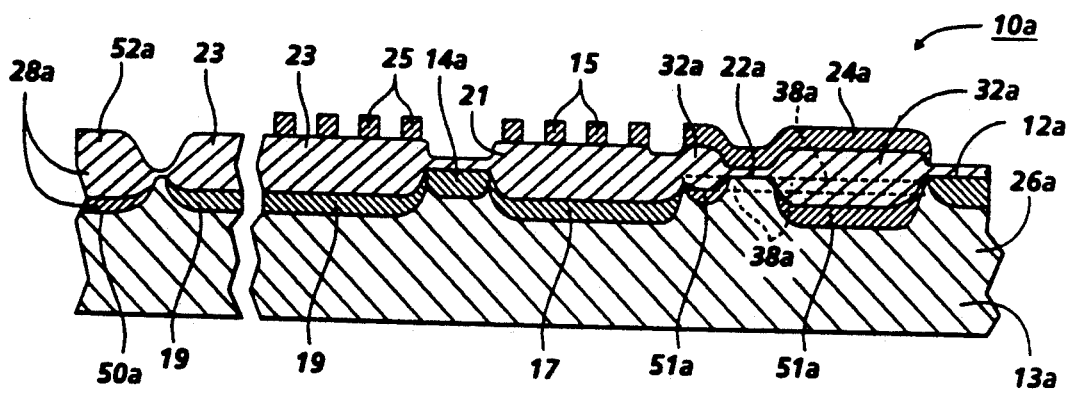
FIG. 4 is a cross-sectional view of an alternate embodiment of an FET embodying the present invention.

FET 10 has the normal arrangement of drain region 14, gate 24 and source region 26. In contrast, referring now to FIG. 4 there is shown an FET 10a, substantially similar to FET 10, but having an inverted order of drain region 14a and source region 26a. In FIG. 4, elements of FET 10a that correspond to elements of FET 10 are label the same as the FET 10 elements, except that a letter a is added to the number (e.g., source region 26 in FIG. 3 becomes source region 26a in FIG. 4). FET 10a is constructed on a major surface 12a of a substrate 13a. Substrate 13a is doped p with boron in a peak concentration of about $8 \times 10^{13}$ atoms per cubic centimeter. FET 10a includes generally circular source region 26a, doped n+. Preferably source region 26a is doped with phosphorus in a peak concentration of about $10^{19}$ to $10^{20}$ atoms per cubic centimeter. Source region 26a has a diameter of about 50 micrometers. Outside of source region 26a is gate oxide region 22a. Preferably gate oxide region 22a consists of a 1000 angstroms thick layer of thermally grown silicon dioxide having a radial thickness of about 14 micrometers. Outboard of gate oxide region 22a is drift region 17. Preferably drift region 17 has a radial thickness of about 330 micrometers, and is doped with phosphorus in a peak concentration of about $10^{16}$ atoms per cubic centimeter. FET 10a includes field plate 15 to spread field lines in the underlying drift region 17. Field plate 15 is generally annular in shape, is positioned above drift region 17, and is separated from drift region 17 by generally annular field oxide region 21. Preferably field plate 15 consists of two or more concentric, conductive rings, connected by a high resistance polysilicon connector (not shown) that acts as a voltage divider. Alternatively, field plate 15 consists of a conductive spiral. Overlying gate oxide region 22a is gate 24a. Gate 24a also overlies a part of field oxide region 21 adjacent gate oxide region 22a.

Outside of drift region 17 is generally annular drain region 14a, which is doped n+. Preferably drain region 24a has a radial thickness of about 15 micrometers, and is doped with phosphorus in a peak concentration of about $10^{19}$ to $10^{20}$ atoms per cubic centimeter. Outside of drain region 14a is drift region 19, which is constructed like drift region 17. FET 10a includes field plate 25 to spread field lines in the underlying drift region 19. Field plate 25 is generally annular in shape, is positioned above drift region 19, and is separated from drift region 19 by generally annular field oxide region 23. Preferably field plate 25 consists of two or more concentric, conductive rings, connected by a high resistance polysilicon connector (not shown) that acts as a voltage divider. Alternatively, field plate 25 consists of a conductive spiral. Outside of drift region 19 is a channel stop portion 28a. Channel stop portion 28a serves to isolate FET 10a from other devices (not shown) on major surface 12a.

In accordance with the present invention, FET 10a includes a channel stop portion 32a that is positioned underneath gate 24a between and in contact with source region 26a and drift region 17. Channel stop portion 32a defines a channel region 38a between drift region 17 and source region 26a. Although gate 24a overlies both channel stop portion 32a and channel region 38a, communication between source region 26a and drift region 17 (and then drain region 14a) is only possible through channel region 38a, since channel stop portion 32a blocks or stops other communication between source region 26a and drift region 17. Preferably channel stop region 32a consists of a generally annular region 51a, doped p+, which is overlaid by a generally annular field oxide region 32a.

The method of the invention can best be understood by reference to FIGS. 5 through 13, which illustrate the sequence of steps in the process of making FET 10. The method of the invention follows many of the same steps as normally used to fabricate self-aligned gate MOS devices, steps that are well known to those skilled in the art. Consequently, the process steps before and after the description of the present invention will not be detailed.

Figure 5:
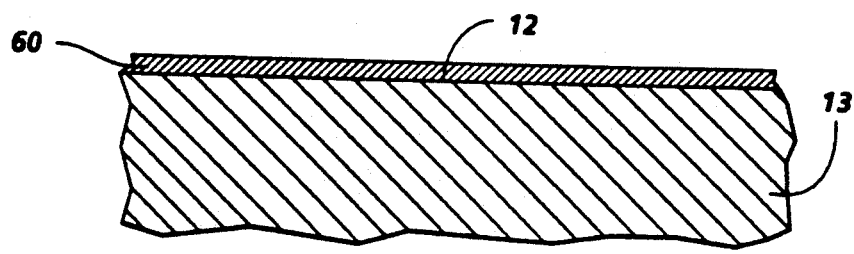
FIGS. 5 through 13 are cross-sectional views, taken in the direction of the arrows of FIG. 2, that show successive steps used to make the FET of FIG. 1.

Referring now to FIG. 5, there is shown substrate 13 having major surface 12. Preferably substrate 13 is a silicon crystal wafer (e.g., a<100> silicon crystal) doped p. Alternatively, substrate 13 could be a germanium crystal wafer, a semiconductor on insulator (e.g., silicon on sapphire or on ceramic). In accordance with the method of the present invention, an initial insulating layer 60 is placed on major surface 12. Insulating layer 60 serves to protect the underlying substrate. Preferably, insulating layer 60 consists of a 1400 angstroms thick layer of thermally grown silicon dioxide. Thermally growing the silicon dioxide layer 60 helps insure that underlying major surface 12 is uniform.

Figure 6:
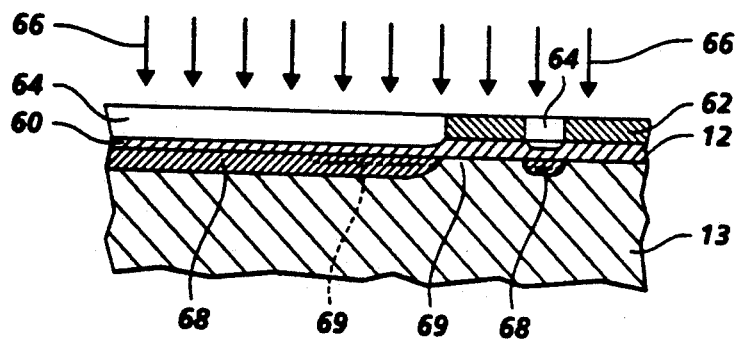

Referring now to FIGS. 2 and 6, next a field implant mask 62 is formed on insulating layer 60. Mask 62 preferably consists of a layer of photoresist that is patterned and etched to create aperture 64. Aperture 64 delineates where field implant 66 will be implanted in major surface 12 to form field implant region 68. In accordance with the method of the present invention, field implant region 68 will later become respective field implant portions 50 and 51 of channel stop portions 28 and 32. Preferably aperture 64 is shaped to form field implant region 68 not only where required to later form channel stop portions 28 and 32, but also where source region 26 will later be formed. This shape for aperture 64 simplifies mask 62.

Before field implant 66 is implanted, mask 62 is used in an etching step to reduce the thickness of portions of insulating layer 60 that underlie aperture 64 (e.g., leaving a thickness of 300–500 angstroms of silicon dioxide), an operation that tailors implant 66 by controlling the depth of penetration of implant 66 into major surface 12. Field implant 66 consists of a p+dosage of a p type impurity, such as boron. Preferably the peak concentration of boron atoms is about $10^{17}$ atoms per cubic centimeter. Field implant region 68 defines a region 69 in which channel 38 will later be formed.

Figure 7:
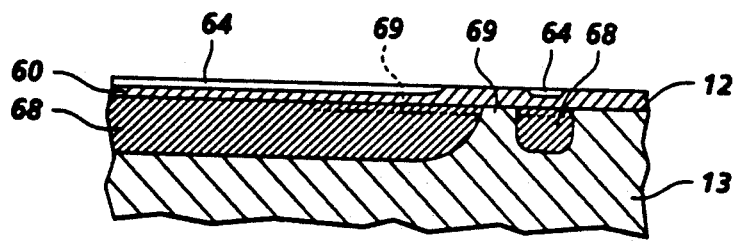

Referring now to FIG. 7, mask 62 is removed after implant 66 forms implant region 68. Insulating layer 60 is then annealed to smooth its surface while driving in implant region 68, thereby increasing both depth and lateral dimensions of implant region 68, and defining channel 38.

Figure 8:
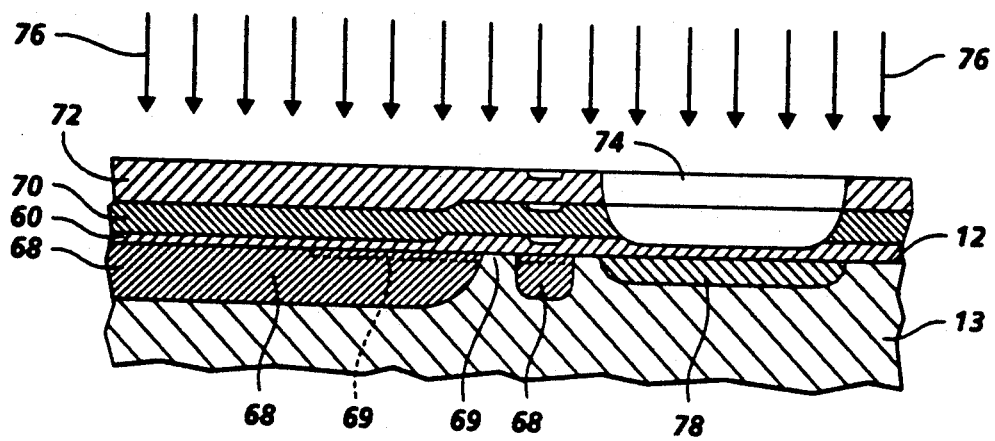

Referring now to FIGS. 2 and 8, next drift implant region 78 is formed. Drift implant region 78 will later become drift region 16. Drift implant region 78 is formed by depositing an insulating layer 70 on insulating layer 60, then covering insulating layer 70 with a layer 72 of photoresist. Preferably insulating layer 70 consists of about a 1000 angstrom thick layer of deposited silicon nitride. Photoresist layer 72 is patterned and etched to leave aperture 74 overlying the region of major surface 12 in which drift region 16 will later be formed. Using photoresist layer 72 as a mask, the portion of insulating layer 70 underlying aperture 74 is completely etched, then the portion of insulating layer 60 underlying aperture 74 is partially etched using a plasma etch. Finally, n type implant 76 is implanted to form drift implant region 78. Preferably implant 76 is phosphorous. The partial etching of layer 60 aids alignment of subsequent masks and tailors implant 76 to form drift implant region 78 to the desired dimensions and impurity concentration, as is well known to those skilled in the art.

Figure 9:
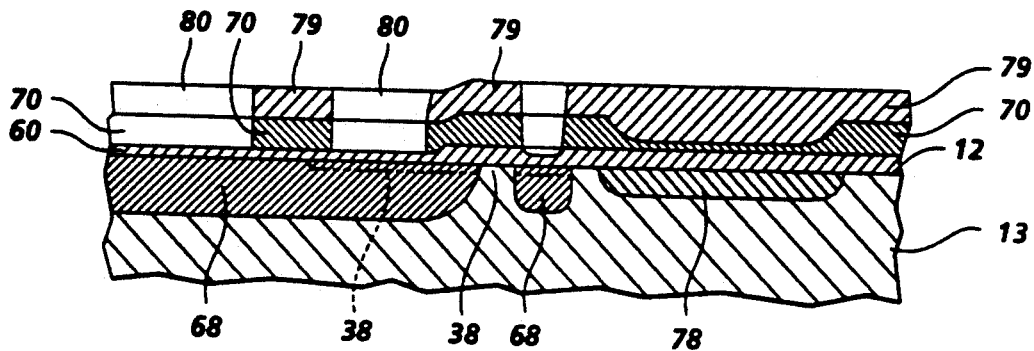
Figure 10:
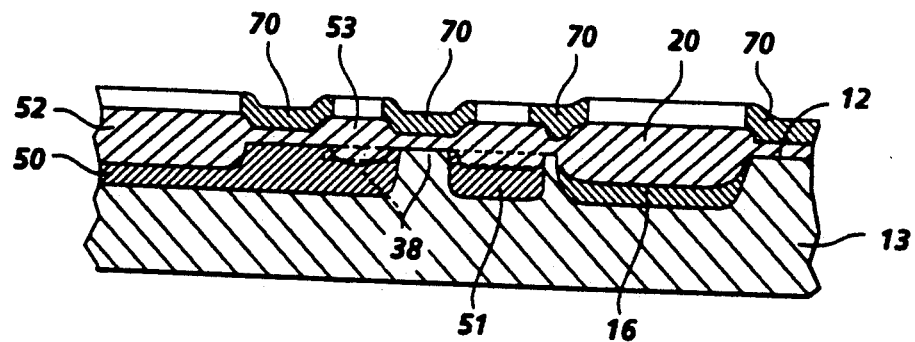

Referring now to FIGS. 2 and 9, next field oxide regions 20 and 52 are formed. To define field oxide regions 52, photoresist layer 72 is removed and in its place photoresist layer 79 is applied. Photoresist layer 79 is patterned and etched to define apertures 80 under which field oxide regions 52 will be formed. Next, the regions of insulating layer 70 underlying apertures 80 are completely etched, but the regions of silicon dioxide insulating layer 60 underlying apertures 80 are only partially etched in order to insure that insulating layer 60 is completely removed. Referring now to FIGS. 8 and 9, photoresist layer 79 is removed, and field oxide is grown where major surface 12 is not masked by nitride insulating layer 70, thereby creating field oxide regions 20, 52 and 53. Field oxide region 20 grows into drift implant region 78, creating drift region 16 in place of drift implant region 78. Similarly, field oxide regions 52 grow into impurity region 68, creating field implant portion 50 in place of implant region 68. Preferably field oxide regions 20, 52 and 53 are about 2.2 micrometers thick.

Figure 11:
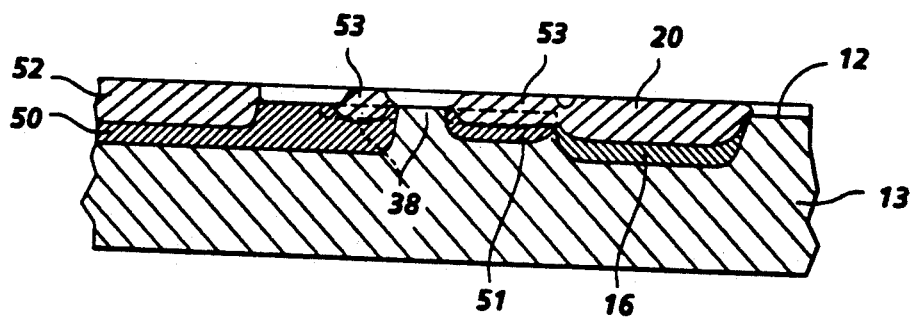
Figure 12:
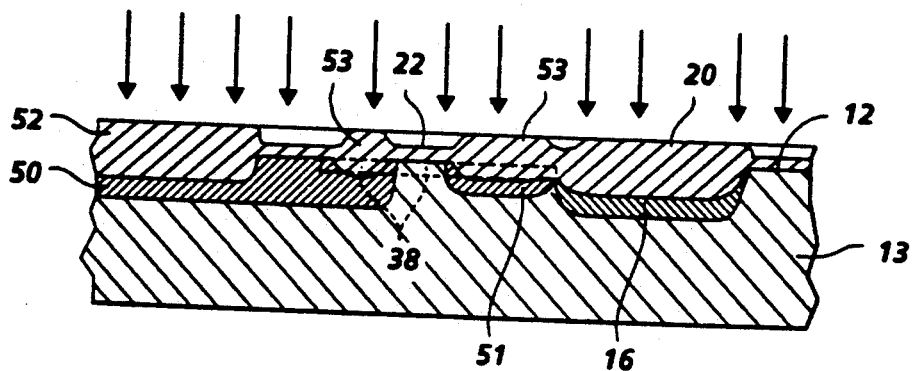

Referring now to FIGS. 2 and 11, in preparation for forming gate oxide 22, the remaining portions of insulating layer 70 are removed by etching, a process that also decreases the thickness of field oxide regions 20, 52 and 53 by about 2000 angstroms. Referring now to FIGS. 2 and 12, gate oxide 22 is formed, preferably by thermally growing a 1000 angstrom thick layer of silicon dioxide. The process of growing gate oxide 22 also increases the thickness of field oxide regions 20 and 52.

After gate oxide 22 is formed, FET 10 can be made to be either an n channel depletion mode device or a p channel enhancement mode device, as is well known to those skilled in the art. The depletion mode is obtained by implanting an optional n− blanket implant 81, as shown in FIG. 12. Implant 81 dopes channel 38 n−. To make FET 10 a p channel enhancement mode device, optional implant 81 would be omitted. Preferably, implant 81 consists of phosphorus implanted in an amount sufficient to overcome the p doping of substrate 13.

Figure 13:
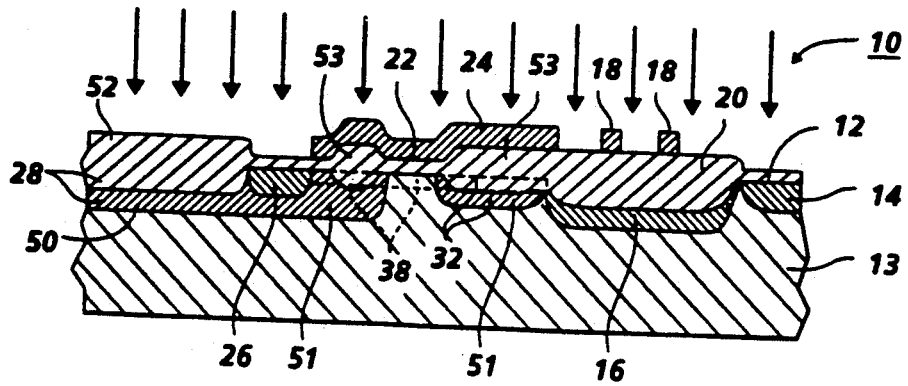

Referring now to FIG. 2, 3, and 13, gate 24 and field plate 18 are next formed, preferably from deposited polysilicon that is doped with n-type impurities in concentrations sufficient to make the polysilicon conductive, then patterned and etched. Field plate 18 preferably consists of a series of concentric rings or a spiral. Next, source region 26 and drain region 14 are formed by applying a blanket implant 83 of n type impurities, with gate 24 and field oxide region 20 acting as a mask to align source region 26, gate 24, drift region 16 and drain region 14, as is well known to one skilled in the art.

Preferably implant 83 consists of phosphorus implanted with a peak concentration from about $10^{19}$ to $10^{20}$ atoms per cubic. Note that implant 83 creates source region 26 in a portion of major surface 12 previously implanted with p field implant 66. Since the peak concentration of implant 83 is 100 to 1000 times the peak concentration of implant 66, the effects of implant 66 on source region 26 is insignificant.

While the invention has been described with reference to the structures disclosed, it is not confined to the specific details set forth, but is intended to cover such modifications or changes as may come within the scope of the claims.

What is claimed is:

1. A high voltage field effect transistor constructed on the major surface of a substrate of a first conductivity type, including:
    a drain region of a second conductivity type located in the major surface;
    a generally annular drift region of the second conductivity type, located in the major surface and outside of the drain region;
    a generally annular gate located on the major surface and outside of the drift region;
    a generally annular source region located in the major surface and outside of the gate;
    a first channel stop located in the major field surface and outside of the source region;
    a second channel stop located in the major surface and beneath the gate, having at least two portions in close proximity to each other; and
    a channel region located in the major surface and between the two second channel stop portions, the second channel stop blocking communication between the source region and the drift region except through the channel region.

2. The high voltage field effect transistor of claim 1, wherein the channel region is of the second conductivity type.

3. The high voltage field effect transistor of claim 1, wherein first channel stop includes a first field implant region of first conductivity type located in the major surface and a first field oxide region positioned in the major surface above the first field implant region.

4. The high voltage field effect transistor of claim 3, wherein the second channel stop includes a second field implant region.

5. The high voltage field effect transistor of claim 4, wherein the second channel stop includes a second field oxide region positioned above the second field implant region.

6. A high voltage field effect transistor constructed on the major surface of a substrate of a first conductivity type, including;
    a source region of a second conductivity type located in the major surface;
    a generally annular gate located on the major surface and outside of the source region;
    a generally annular first drift region of the second conductivity type, located in the major surface and outside of the gate;
    a generally annular drain region located in the major surface and outside of the first drift region;
    a generally annular second drift region of the second conductivity type, located in the major surface and outside of the drain region;
    a first channel stop located in the major field surface and outside of the drain region; a second channel stop located in the major surface and beneath the gate, having at least two portions in close proximity to each other; and
    a channel region located in the major surface and between the two second channel stop portions, the second channel stop blocking communication between the source region and the first drift region except through the channel region.

7. The high voltage field effect transistor of claim 6, wherein the channel region is of the second conductivity type.

8. The high voltage field effect transistor of claim 6, wherein first channel stop includes a first field implant region of first conductivity type located in the major surface and a first field oxide region positioned in the major surface above the first field implant region.

9. The high voltage field effect transistor of claim 8, wherein the second channel stop includes a second field implant region.

10. The high voltage field effect transistor of claim 9, wherein the second channel stop includes a second field oxide region positioned above the second field implant region.

* * * * *